United States Patent [19]
Fowler et al.

[11] Patent Number: 6,101,844
[45] Date of Patent: Aug. 15, 2000

[54] DOUBLE WALL REACTION CHAMBER GLASSWARE

[75] Inventors: Jack D. Fowler, Riverside; Robert Parvin, Yorba Linda; Jeffrey Kowalski, Dove Canyon; Patrick W. Wiesen, Laguna Niguel, all of Calif.

[73] Assignee: Silcon Valley Group Thermal, San Jose, Calif.

[21] Appl. No.: 09/022,056

[22] Filed: Feb. 10, 1998

[51] Int. Cl.[7] .................................................. C23C 16/00
[52] U.S. Cl. ................. 65/41; 65/42; 156/89.11; 156/308.2; 156/308.4; 118/715; 118/725
[58] Field of Search .................... 118/715, 725; 65/41, 42; 156/89.11, 308.2, 308.4

[56] References Cited

U.S. PATENT DOCUMENTS

| | | | |
|---|---|---|---|
| 4,640,223 | 2/1987 | Dozier | 118/725 |
| 4,720,407 | 1/1988 | Schulke | 428/36 |
| 4,991,540 | 2/1991 | Jurgensen et al. | 118/715 |
| 4,992,044 | 2/1991 | Philipossian | 432/253 |
| 5,308,955 | 5/1994 | Watanabe | 118/725 |
| 5,320,680 | 6/1994 | Learn et al. | 118/724 |
| 5,370,736 | 12/1994 | Roy et al. | 118/719 |
| 5,383,984 | 1/1995 | Shimada et al. | 156/345 |
| 5,441,570 | 8/1995 | Hwang | 118/725 |
| 5,578,132 | 11/1996 | Yamaga et al. | 118/724 |
| 5,618,351 | 4/1997 | Koble, Jr. et al. | 118/728 |
| 5,622,639 | 4/1997 | Kitayama et al. | 219/390 |

*Primary Examiner*—Richard Bueker
*Attorney, Agent, or Firm*—Flehr Hohbach Test Albritton & Herbert LLP

[57] ABSTRACT

A double wall reaction chamber assembly comprising a cylindrical inner wall and a cylindrical outer wall axially parallel thereto, the inner wall having an annular junction with a thickened annular junction flange on the outer surface thereof. The lower end of the outer wall being fused to the outer surface of the thickened annular junction. The outer surface of the inner wall and the inner surface of the annular junction flange define a sloping annular drainage channel to a downwardly sloping drainage port, enabling liquid to drain from the junction. The double wall reaction chamber assembly has a cylindrical inner wall and a cylindrical outer wall axially parallel thereto. It has a lower end fused to the inner wall. A gas distribution tube has a gas inlet end and a gas distributor end, the gas distributor end comprising a split tee having a junction. One leg of the tee extends in a first direction from the junction around the inner wall to a first outlet terminus, and the other leg of the tee extends from the junction in a second direction around the inner wall in a direction opposite to the first direction and to a second outlet terminus. The legs of the tee slope downward from the junction to the respective outlet terminus, whereby liquid in the gas distributor will completely drain from the assembly.

20 Claims, 4 Drawing Sheets

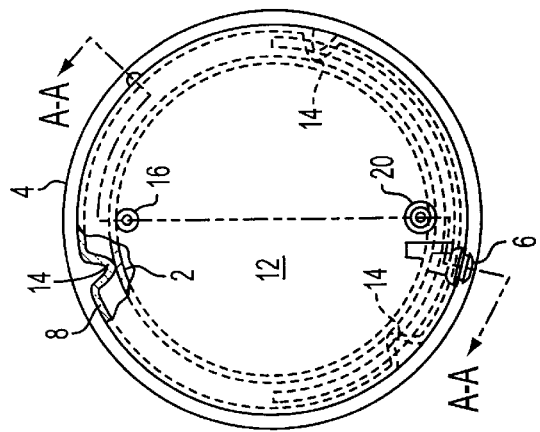
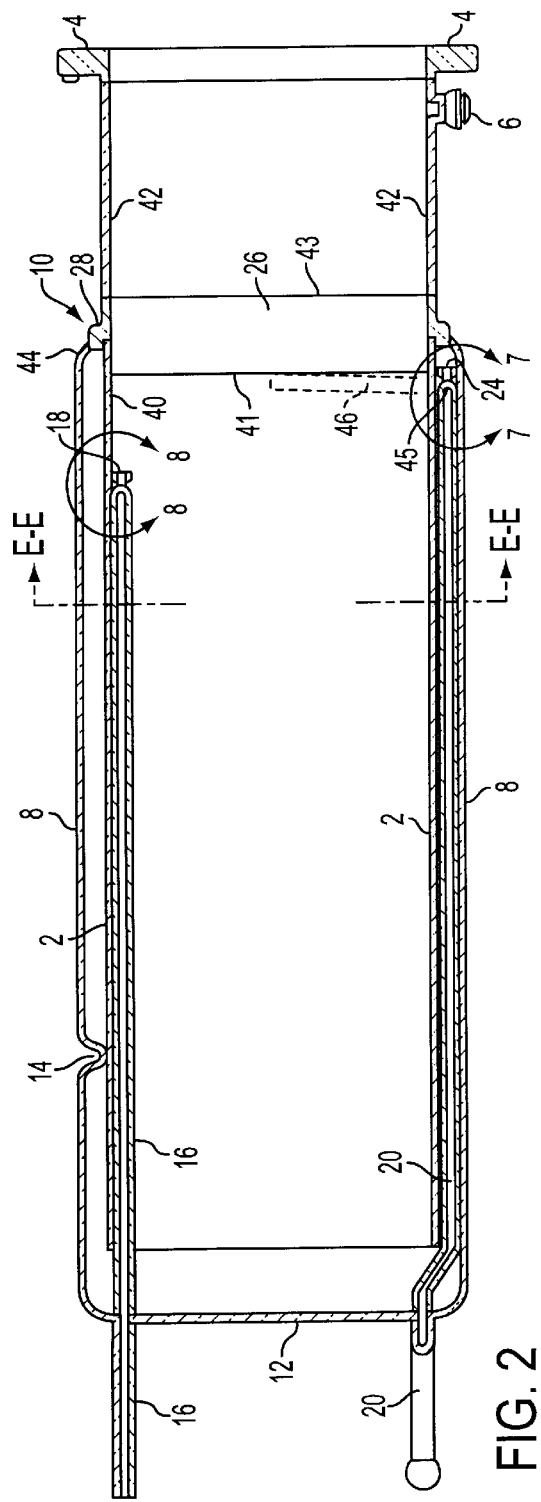

ved in the furnace. The double wall construction of the prior art devices

DOUBLE WALL REACTION CHAMBER GLASSWARE

FIELD OF THE INVENTION

This invention relates to improved double wall glassware for furnaces used for thermal treatments and chemical vapor depositions of semiconductor wafers. In particular, this invention relates to unitary double wall glassware with a structure which permits lathe construction and joining of the two cylinder walls with reduced risk of thermal stress fractures and which allows complete draining of condensates, and cleaning and rinse liquids from the assembly.

BACKGROUND OF THE INVENTION

Semiconductor wafer coatings are produced by deposition from chemical vapors, oxidation and other processes and are modified by oxidation and thermal treatment to form integrated circuits and other electronic products. These processes are performed in the reaction chambers of furnaces, the reaction chambers being formed by one or more walls of inert materials such as highly pure quartz. The wafers are positioned within a reaction chamber of the furnace during operation of the semiconductor manufacturing processes.

One of these types of furnaces is a vertical reactor such as shown in U.S. Pat. Nos. 5,320,680 and 5,618,351, the entire contents of which are hereby incorporated by reference. For purposes of clarity of explanation, the embodiment of the glassware described in this application is for a vertical reactor, although many aspects of the invention have utility in horizontal and other types of reaction furnaces, and the inventions is not limited to the vertical furnace glassware. In this application, references made to upward and downward directions relating to the glassware components and assembly are made in reference with the glassware components assembled along a vertical axis in the ultimate operating orientation of the glassware in a vertical reactor, and are intended to apply to the glassware construction in any orientation including both vertical and horizontal orientations.

In vertical furnaces, the reaction chamber can defined by a pair of concentric tubes or cylinders of quartz or other inert material which will retain their structural integrity at the elevated temperatures required for the reaction to take place in the furnace.

The double wall construction of the prior art devices present a serious cleaning problem. The internal glassware becomes coated with deposition chemicals during use, risking contamination from the coating materials, particularly when the coating fragments during repeated heating and cooling cycles. It is thus necessary to remove and clean the internal glassware from time to time. The coatings are removed by solubilizing them in chemical cleaning baths, and after the chemical solutions are removed, the residual chemicals are removed by rinsing in deionized water. Complete removal of the chemical solutions and the rinse water is required before the glassware can be reused. With double wall structures, removal of the liquid residues following chemical bath treatment and rinsing is difficult, particularly at the wall junctures. Drying the glassware in heated ovens or for prolonged periods in the atmosphere are required with the prior art devices. Furthermore, any condensates forming in the glassware tubes during lower temperature cycling operation is trapped, impairing continued use of the glassware and threatening contamination of wafers during successive operations.

Production of a unitary double wall construction of quartz tubes has been limited because of structural problems arising from the assembly and operation of the products. To provide for liquid drainage, prior art devices have been fabricated with non-concentric, off-axis constructions to provide sloped drainage surfaces. The constructions require manual assembly and welding of stationary components, yielding uneven welds with uneven wall thicknesses. At the point where the components are joined, differential cooling and contraction causes stress fractures during the cooling and before the stresses in the juncture could be relieved by annealing. Gas distribution tubes were generally vertically aligned because they did not have the structural integrity to resist bending or other structural distortions under gravity forces in elevated furnace temperatures, requiring the use of multiple tubes for reaction gas injections from multiple points in the chamber.

Sloped drainage surface glassware of this configuration required hand welding of all parts, yielding irregular joints and uneven welds which greatly reduce the structural integrity of the product and are points of fracture in the cycling heating and cooling environment of the thermal processors. Lathe welding of the off-axis components was not possible with their construction because lathe joining operations require a constant radius, co-axial construction for the components being joined on the lathe.

OBJECTS AND SUMMARY OF THE INVENTION

It is one object of this invention to provide a double wall reaction chamber structure from which liquids can be easily drained.

It is another object of this invention to provide a double wall quartz reaction chamber structure with can be manufactured with a reduced risk of stress fractures during its manufacture.

It is a still further object of this invention to provide a double wall quartz reaction chamber structure with a split gas distributor which is structurally stable during elevated furnace temperatures.

It is a yet further object of this invention to provide a coaxial, symmetrical glassware construction incorporating fully sufficient drainage channels, the structure permitting rotational assembly and welding on turning lathes, yielding even wall thicknesses along the welds and greatly increasing the integrity and life of the product in the recycling heating and cooling environment in the thermal reactors.

In summary, the double wall semiconductor reaction chamber glassware assembly of this invention comprises a cylindrical inner wall and a cylindrical outer wall axially parallel thereto, the inner wall having an annular junction with a thickened annular junction flange defined by the outer surface thereof, the flange portion being preferably thicker than the thickness of the inner wall. The lower end of the outer wall is fused to the outer surface of the thickened annular junction. The inner wall can have opposite first and second sides, the outer surface of the inner wall and the inner surface of the annular junction flange defining an annular drainage channel sloping from a highest point on the first side of the cylindrical wall to a lowest point on the second side of the cylindrical wall.

In this assembly, the inner wall can have a downwardly sloping drainage port, the upper end thereof communicating with the lowest point of said drainage channel, whereby liquid in the drainage channel will completely drain from the channel.

The assembly can also comprise a cylindrical inner wall and a cylindrical outer wall axially parallel thereto and having a lower end fusedly connected to the inner wall, a gas distribution tube having a gas inlet end and a gas distributor end, the gas distributor end comprising a split tee having a junction. One leg of the tee extending in a first direction from the junction around the inner wall to a first outlet terminus and the other leg of the tee extending from the junction in a second direction around the inner wall in a direction opposite to the first direction and to a second outlet terminus, the slope of each leg of the tee sloping downward from the junction to the respective outlet terminus, whereby liquid in the gas distributor will completely drain from the assembly.

BRIEF DESCRIPTION OF THE DRAWINGS

FIG. 1 is a top view of the double wall reaction chamber structure of this invention.

FIG. 2 is a cross-sectional view of the double wall reaction chamber structure of FIG. 1 taken along the line A—A.

DETAILED DESCRIPTION OF THE INVENTION

Figure 3:
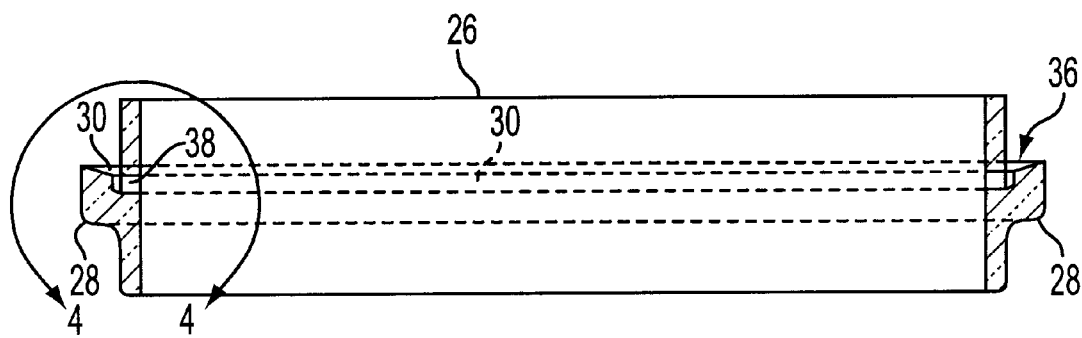
FIG. 3 is a cross-sectional view of the junction section prior to its fusion with tubing to form the inner tube, showing the configuration of the drainage channel.

The double wall reaction chamber glassware of this invention has an improved symmetrical, coaxial and preferably cylindrical construction which permits more reliable assembly, with lower product loss from stress fractures caused by cooling during construction, and with a structure which permits quick and immediate drainage of liquids from the system during cleaning. The construction described herein is quartz, but the construction can be easily applied to other thermally stable materials with the purity required for use in semiconductor device construction such as silicon carbide and the like.

FIG. 1 is a top view of the double wall reaction chamber structure of this invention, and FIG. 2 is a cross-sectional view of the double wall reaction chamber structure of FIG. 1, taken along the line A—A. The double wall reaction chamber structure comprises an inner wall 2 having an annular support flange 4 and an gas exhaust port 6 at its lower end. The outer wall 8 is joined at its lower end 44 to the double wall junction 10 and has an end closure 12 at its upper end. The inner wall 2 and outer wall 8 each have a uniform radius and are preferably constant radius cylinders to enable lathe joinder.

A coplanar and preferably evenly spaced array of dimples or indentations 14 in the outer wall 8 extend to contact the outer surface of the inner wall 2 and act as stabilizing spacers maintaining a precise distance between the two walls and protecting the wall junction 10 from bending stresses. The inner and outer walls are preferably coaxial and symmetrical.

A temperature sensor well 16 extends through the end closure 12 and is fused thereto. It is positioned adjacent the inner wall in an orientation parallel to the central axis of the wall structure has a support 18 shown in greater detail in FIG. 8.

A gas distributor conduit 20 also extends through the end closure 12 and is fused thereto. It is positioned between the inner wall 2 and the outer wall 8. The gas distributor has a split, with downwardly sloping legs 46, 50 shown in greater detail in FIG. 5. At the center of the split, the distributor has a central support 24 shown in greater detail in FIG. 7.

The outer surfaces of the temperature sensor well 16 and the gas distributor conduit 20 are preferably fused to the end closure 12 where they pass through it to form sealed junctions.

Figure 4:
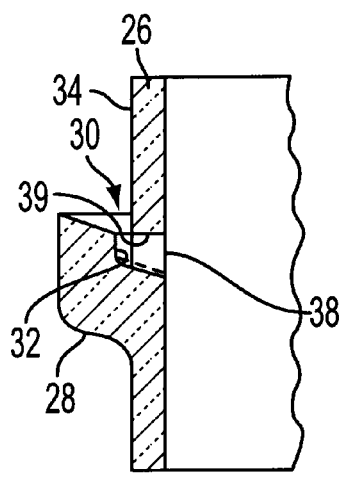
FIG. 4 is an enlarged cross-sectional view of the drainage port portion of the junction section shown in FIG. 3 showing the configuration of the drainage port.

FIG. 3 is a cross-sectional view of the wall junction section 10 prior to its fusion with the inner tubes or cylinders 40 and 42 to form the inner tube. It shows the configuration of the drainage channel 30. FIG. 4 is an enlarged cross-sectional view of the drainage port portion of the junction section 10 shown in FIG. 3, including the sloped configuration of the drainage port 38.

The junction section is a precision machined annular, circular junction ring 26 having a constant radius and made of quartz with an annular junction flange 28 on or defined by the outer surface thereof. An annular, downward sloping drainage channel is defined by the inner flange wall 32 and the outer ring wall 34, extending around both sides of the ring 26 from the highest elevation 36 to the lowest elevation adjacent the drainage port 38. The drainage port 38 slopes downward from its upper end 39 communicating with the lowest end of the drainage channel 30 to a lower point on the opposite side of the wall of the ring 26.

Referring back to FIG. 2, the inner wall 2 is formed from an upper section 40 and a lower section 42 between which the junction ring 26 is fused on a lathe along junctions 41 and 43 by standard, conventional lathe joining procedures to form a unitary structure. In these procedures, the portions to be joined are positioned and bought together in a coaxial orientation until the surfaces to be joined are butted either before or during rotation of the pieces about their common axis on the lathe. Heat is then applied to the edges of the joint, fusing the abutting surfaces into a common. Since the wall structures have a cylindrical configuration with a constant and uniform radius, they can be turned on the lathe during assembly and fused, producing a homogeneous weld of constant wall thickness which cannot be detected after assembly. This type of joint has the same integrity as the original cylinder wall during thermal cycling in the reactor.

The lower edge 44 of the outer wall cylinder 8 is fused to the outer surface of the junction flange 28 while rotating on a lathe by standard procedures described above to form a unitary joint.

The junction flange 28 has increased thickness to provide a larger mass or heat reservoir, reducing the rate of temperature change immediately after the cylinders 3, 8 are joined by fusion. This allows movement of the unitary structure to an annealing oven with a greatly reduced risk of stress fractures destroying the product. The increased thickness also strengthens the joint, reducing fracture of the unitary assembly during movement from one location to another or during its placement in or removal from the furnace and during thermal cycling in the reactor.

Figure 5:
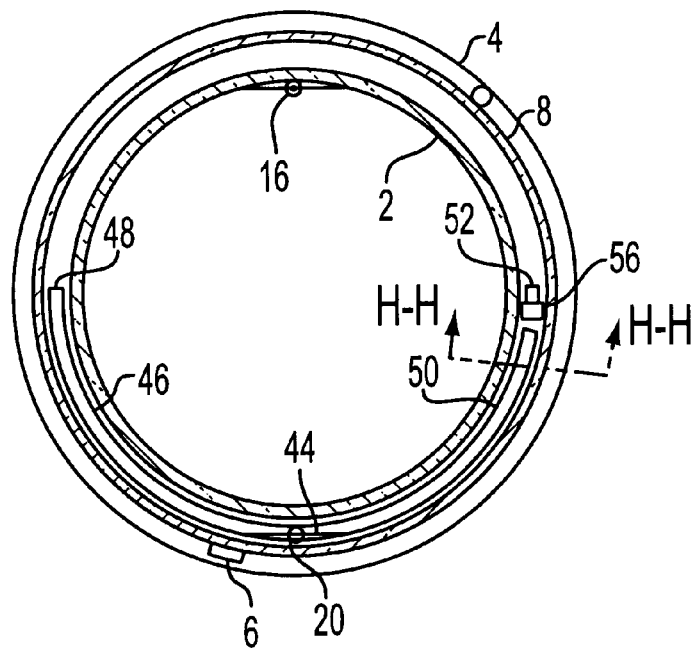
FIG. 5 is a cross-sectional view of the double wall reaction chamber structure of FIG. 2, taken along the line E—E, showing the split gas distributor.

FIG. 5 is a cross-sectional view of the double wall reaction chamber structure of FIG. 2, taken along the line E—E to show the split gas distributor. The lower end of the gas distributor 20 splits into a T 45 or tee shape, one leg 46 of the tee extending in one direction around the surface of the inner wall to its outlet terminus 48, and the other leg 50 of the T extending in the opposite direction around the surface of the inner wall to its outlet terminus 52. As shown in FIG. 2, the legs (46,50) of the T are downwardly sloped from the junction of the T at their highest point to each respective terminus (48,52), at their lower point, so any liquid present therein will completely drain from the tubing.

Figure 6:
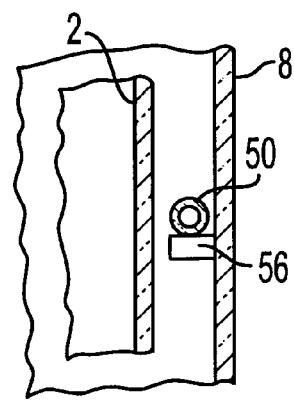
FIG. 6 is a cross-sectional view of the split gas distributor shown in FIG. 5, taken along line H—H.

FIG. 6 is a cross-sectional view of the split gas distributor shown in FIG. 5, taken along line H—H. To support the legs of the tee and prevent slumping during elevated operating temperatures, leg supports 56 adjacent the respective terminus (48,52) are fused to the inner surface of the outer wall 8, for example.

Figure 7:
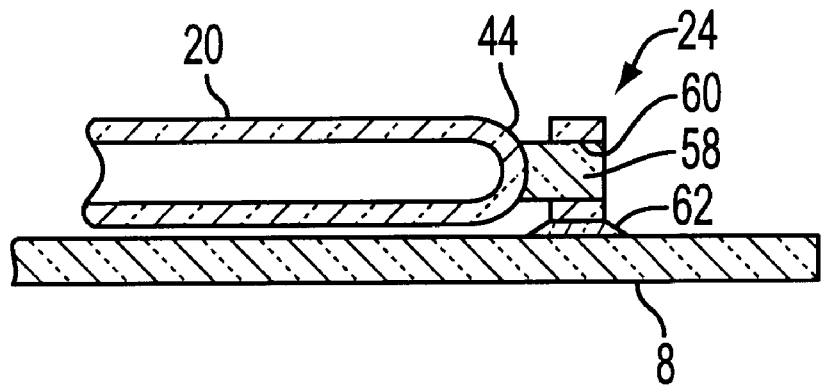
FIG. 7 is an enlarged cross-sectional view of the split gas distributor support 24 shown in FIG. 2.

FIG. 7 is an enlarged cross-sectional view of the split gas distributor support 24 shown in FIG. 2. A projection 58 fused to the lower end of the distributor conduit 20 at the tee 45 fits into receptor 60 on a support 62 fused to the outer wall 8 to hold or lock the gas distributor tube 20 into place and to provide axial support to the tube.

Figure 8:
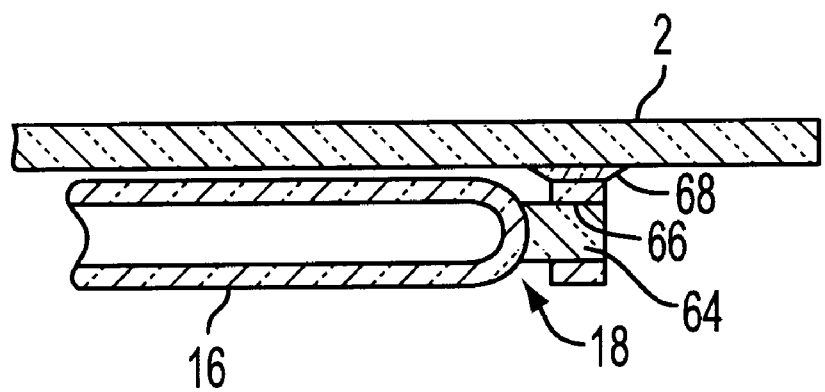
FIG. 8 is a cross-sectional view of the temperature sensor well support 18 shown in FIG. 2.

FIG. 8 is a cross-sectional view of the temperature sensor well support 18 shown in FIG. 2. A projection 64 fused to the lower end of the temperature sensor well 16 fits into the receptor 66 on a support 68 fused to the inner wall 2 to hold or lock the well 16 into place and provide axial support to the well.

The double wall reaction chamber assembly of this invention provides a thickened junction flange 28 for the wall junctions to provide increased strength and a heat reservoir to reduce the cooling rate of the junction 10 after it is formed and to maintain an elevated temperature during movement of the newly welded assembly to an annealing oven.

Drainage of cleaning solutions and rinse liquids from the assembly is facilitated by the provision of a sloped drainage channel 30 extending to a drainage port 38 where the inner and outer walls are joined and a tee-shaped gas distributor with downwardly sloping legs 46 and 50 from the junction of the tee to the outlet terminus 48, 52 of each leg.

Because of the coaxial construction of the two wall system and the annular configuration of the joint, the joint ring 26 can be assembled and welded to the inner wall on a rotating lathe yielding a seamless joint with uniform wall thickness. In a similar manner, the outer wall cylinder can be assembled and welded to the joint flange 28 on a rotating lathe, yielding a highly uniform weld joining the two walls. This coaxial, symmetrical glassware construction incorporates fully sufficient drainage channels, and permits assembly and welding on lathes, yielding even and uniform wall thickness along the welds and greatly increasing the integrity and life of the product in the recycling heating and cooling environment in the thermal reactors.

It will be readily apparent to a person skilled in the art that numerous modifications and variations of the present invention are possible in light of the above teachings. It is therefore to be understood that within the scope of the appended claims, the invention may be practiced otherwise than as specifically described herein.

The invention claimed is:

1. A reaction chamber for processing substrates, the reaction chamber comprising:
   (a) an outer wall having an inner surface, an outer surface and a lower end; and
   (b) an inner wall axially parallel to the outer wall, the inner wall having an inner surface, an outer surface and a junction section configured to join the lower end of the outer wall to the outer surface of the inner wall, the junction section comprising:
      (i) an annular flange projecting from the inner wall, the annular flange having an inner flange surface in a facing relationship with the outer surface of the inner wall and an outer flange surface fused to the lower end of the outer wall; and
      (ii) a drainage channel defined by the inner flange surface and the outer surface of the inner wall.

2. A reaction chamber according to claim 1 wherein the inner wall further comprises at least one drainage port communicating between the drainage channel and the inner surface of the inner wall.

3. A reaction chamber according to claim 2 wherein the drainage port comprises a sloped drainage surface.

4. A reaction chamber according to claim 2 wherein the inner flange surface forms an angle relative to the outer surface of the inner wall.

5. A reaction chamber according to claim 8 wherein the annular flange comprises a thickness between the inner flange surface and the outer flange surface that is greater than a thickness between the inner surface of the inner wall and the outer surface of the inner wall.

6. A reaction chamber according to claim 1 wherein the inner wall comprises an inner cylinder and the outer wall comprises a concentric outer cylinder.

7. A reaction chamber according to claim 6 wherein the outer cylinder comprises a plurality of spacers in contact with the outer surface of the inner cylinder to maintain a substantially equal radial distance between the inner cylinder and the outer cylinder.

8. A reaction chamber according to claim 1 wherein the inner wall comprises a first inner cylinder and a second inner cylinder, and wherein the junction section comprises a circular junction ring disposed therebetween.

9. A reaction chamber according to claim 8 wherein the first inner cylinder the second inner cylinder and the circular junction ring comprise glass, quartz or silicon carbide, and wherein the circular junction ring is fused to the first inner cylinder and the second inner cylinder.

10. A reaction chamber for processing substrates, the reaction chamber comprising:
   (a) an outer wall having an inner surface, an outer surface, a closed end and a lower end;
   (b) an inner wall axially parallel to the outer wall, the inner wall having an inner surface, an outer surface and a junction section configured to join the lower end of the outer wall to the outer surface of the inner wall to define a space therebetween, the junction section having an annular flange projecting from the inner wall with the annular flange fused to the lower end of the outer wall; and
   (c) a gas distributor configured to distribute gas in the space between the inner wall and the outer wall, the gas distributor comprising:
      (i) a conduit projecting through the closed end of the outer wall into the space between the inner wall and the outer wall, the conduit having an inlet proximal to the closed end and a lower end proximal to the junction section;
      (ii) a support affixed to the inner surface of the outer wall; and
      (iii) a projection protruding from the lower end of the conduit and engaging the support to axially support to the conduit.

11. A reaction chamber according to claim 10 wherein the gas distributor further comprises two gas distribution tubes projecting from the lower end of the conduit, the gas distribution tubes projecting circumferentially along the inner surface of the outer wall.

12. A reaction chamber according to claim 11 wherein each of the gas distribution tubes comprises an outlet at an outlet terminus distal from the conduit, the outlet configured to distribute gas into the space between the inner wall and outer wall and to drain liquid from the gas distributor.

13. A reaction chamber according to claim 12 wherein each of the gas distribution tubes slope downward from the lower end of the conduit toward the outlet terminus to drain liquid from the gas distributor.

14. A method of manufacturing a double wall reaction chamber for processing substrates, the method comprising step of:

(a) providing an outer cylinder having an inner surface, an outer surface and a lower end;

(b) providing an inner cylinder having an inner surface, an outer surface and a junction section with an annular flange projecting from the outer surface of the inner cylinder, the annular flange having an inner flange surface in a facing relationship with the outer surface of the inner cylinder and an outer flange surface;

(c) positioning the inner cylinder within the outer cylinder so that the inner cylinder and the outer cylinder are axially aligned along a common axis and so that the lower end of the outer cylinder abuts the outer flange surface;

(d) rotating the inner cylinder and the outer cylinder about the common axis;

(e) fusing the lower end of the outer cylinder to the outer flange surface to form a joint therebetween; and (f) annealing the inner and outer cylinder to relieve stress in the joint between the lower end of the outer cylinder and the outer flange surface caused by different rates of cooling and contraction of the inner cylinder and the outer cylinder.

15. A method according to claim 14 wherein step (b) comprises the step of providing an inner cylinder with an annular flange having a thickness between the inner flange surface and the outer flange surface selected to reduce a rate of temperature change of the joint between step (e) and step (f).

16. A method according to claim 15 wherein step (b) comprises the step of providing an inner cylinder with an annular flange having a thickness between the inner flange surface and the outer flange surface that is greater than a thickness between the inner surface of the inner wall and the outer surface of the inner wall.

17. A method according to claim 14 wherein step (d) comprises the step of rotating the inner cylinder and the outer cylinder about the common axis using a lathe, and wherein step (e) comprises the step of lathe welding the lower end of the outer cylinder to the outer flange surface to provide a seamless joint with substantially uniform thickness therebetween.

18. A method according to claim 14 wherein step (b) comprises the steps of:

(b)(i) forming a circular junction ring; and (b)(ii) fusing a first inner cylinder and a second inner cylinder to the circular junction ring to form the inner cylinder.

19. A method according to claim 18 wherein step (b)(i) comprises the step of forming a circular junction ring wherein the inner flange surface and the outer surface of the inner cylinder define a drainage groove therebetween.

20. A method according to claim 18 wherein step (b)(i) further comprises the step of forming at least one drainage port communicating between the drainage channel and the inner surface of the inner cylinder.

* * * * *

UNITED STATES PATENT AND TRADEMARK OFFICE
CERTIFICATE OF CORRECTION

PATENT NO. : 6,101,844
DATED : August 15, 2000
INVENTOR(S) : Fowler, et al.

It is certified that error appears in the above-indentified patent and that said Letters Patent is hereby corrected as shown below:

On the Title Page, item [73], "Assignee:":
change "Silicon Valley Group Thermal" to
-- Silicon Valley Group Thermal Systems LLC--.

Signed and Sealed this

Twenty-ninth Day of May, 2001

*Attest:*

NICHOLAS P. GODICI

*Attesting Officer*     *Acting Director of the United States Patent and Trademark Office*